(12) United States Patent
Pyo

(10) Patent No.: US 7,037,800 B2
(45) Date of Patent: May 2, 2006

(54) RADIO FREQUENCY SEMICONDUCTOR DEVICE AND METHOD OF MANUFACTURING THE SAME

(75) Inventor: Sung Gyu Pyo, Yongin-Shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 10/878,315

(22) Filed: Jun. 29, 2004

(65) Prior Publication Data

US 2005/0139954 A1 Jun. 30, 2005

(30) Foreign Application Priority Data

Dec. 30, 2003 (KR) .................. 10-2003-0100166

(51) Int. Cl.
*H01L 21/20* (2006.01)
*H01L 29/94* (2006.01)

(52) U.S. Cl. ....................................... 438/381
(58) Field of Classification Search ............... 257/531; 438/381
See application file for complete search history.

(56) References Cited

U.S. PATENT DOCUMENTS 6,744,114 B1 * 6/2004 Dentry et al. ............... 257/532

* cited by examiner

*Primary Examiner*—Douglas W Owens
(74) *Attorney, Agent, or Firm*—Mayer, Brown, Rowe & Maw LLP

(57) ABSTRACT

The present invention discloses a high frequency device including a first wafer providing an inductor having via contact plugs passing through the first wafer and a second wafer bonded to the first wafer, wherein the second wafer provides logic devices and inductor connection lines on an upper side thereof.

11 Claims, 5 Drawing Sheets

RADIO FREQUENCY SEMICONDUCTOR DEVICE AND METHOD OF MANUFACTURING THE SAME

BACKGROUND

1. Field of the Invention

The present invention relates to a radio frequency integrated circuit, and a method for manufacturing the same, and more particularly to, a radio frequency integrated circuit capable of minimizing a parasitic capacitance by sufficiently increasing a distance between a semiconductor substrate on which elements have been formed and an inductor, and a method for manufacturing the same.

2. Discussion of Related Art

According to paradigm variations of information and communication fields, there are increasing demands for communications which can be performed irrespective of time and places. Wireless mobile communication fields have been rapidly developed, satisfying such demands. Radio frequency resources, and materials, devices and circuits operated at a radio frequency are required due to the development of the wireless communication. The radio frequency resources, materials, devices and circuits are used in a radio frequency domain, and thus classified into radio frequency components and integrated circuits.

The radio frequency integrated circuit technology includes combinations of a device manufacturing technology, a circuit design technology and a radio frequency package technology. A competitive RF CMOS can be developed by equally improving each technology. Especially, researches on reduction of production unit cost are essential. For this, a low-priced RF-CMOS technology needs to be developed to reduce a process unit cost by simplifying and stabilizing the whole process. The main components of the RF-CMOS or Bipolar/BiCMOS include an RF MOSFET, an inductor, a varactor, an MIM capacitor and a resistor. However, in both the RF-CMOS and the Bipolar/BiCMOS, the inductor has a low quality factor (hereinafter, referred as 'Q'). In order to increase the Q value of the radio frequency inductor, there has been suggested a method for thickly depositing a low resistance metal except for the device shape. The Q value of the inductor is varied by a number of turns, a width of metal lines, a thickness of the metal lines, an interval between the metal lines, a radius and a shape.

The general guide lines for the design of the inductor will now be described.

1) An interval between metal lines must be minimized. Here, a Q value can be increased by minimizing an inductor area and maximizing mutual inductance.

2) In the case of a multi-layer metal wiring structure, the inductor must be installed on a top metal layer, to minimize a parasitic capacitance to a substrate.

3) The metal lines must be formed as wide and thick as possible. That is, low serial resistances must be obtained. However, if a width of the metal lines excessively increases, the inductor area increases, which results in a high parasitic capacitance and substrate loss. Therefore, proper conditions must be made.

4) A hollow inductor must be implemented, to reduce a negative mutual coupling effect. An inner diameter of the inductor must be five times as large as the width of the metal lines.

5) If a number of turns increases, the inductor area also increases, to facilitate a resistance effect. Here, the parasitic capacitance increases, to reduce the Q value. Accordingly, proper conditions for the number of turns must be made.

In addition to the above five conditions, a method for inserting a trench below an inductor and increasing a thickness of an insulation layer or inserting an earth plate has been investigated due to decoupling.

In order to improve a guide line of the inductor design and solve the above decoupling problem, the inductor, which is a passive component of the radio frequency semiconductor device such as a RD-CMOS device, is formed by applying a damascene process. However, there is a limitation to increase a distance between the substrate and the inductor when the inductor is formed by the damascene process, so that it is difficult to minimize a parasite capacitance to the substrate.

A conventional method for forming an inductor on a device uses a thick single layer metal line having a thickness of 2 to 6 µm to reduce a resistance element of an inductor metal, or forms an inductor on a lower metal line layer to be in parallel to the upper portion, and couples the inductor through a via hole. However, a Q value obtained by the single layer metal inductor is limitative. In order to form a thicker metal inductor, a number of processes increases, and process failure occurs due to increase of entire height topology. That is, it is difficult to form the thicker metal inductor on an on-chip. In addition, a method for forming an inductor according to the MEMS technology has been suggested. It is a double exposure method for forming a thick single photoresist layer, and patterning about 50 µm of dip via hole coupled to a lower layer metal line and an inductor at the same time. However, the structure and properties of the inductor are deteriorated during a process for forming a uniform depth of inductor lines by double exposure or a process for forming a passivation layer after removing the photoresist layer. As a result, researches have been made on the guidelines for the design of the inductor and the method for overcoming decoupling.

Before discussing the technical objects of the present invention, the 3D integration technology necessary for the present invention will now be briefly explained.

A lot of researches and developments have been concentrated on miniaturization of micro-electronic systems because of world-widely accelerated international technical competitions. A chip scale packaging, a flip chip and a multi-chip module have been generally applied to a variety of electronic products such as mobile phones, hand-held computers and chip cards. A very complicated device having various functions is required for the future electronic system. A chip area sharply increases to satisfy such demands. It implies a yield problem by integration of the multifunctional device, large expenses by complexity of the device, and technical limits. In addition, wiring between sub systems has limits due to performance, muti-functions and reliability of the micro-electronic system. Such factors are regarded as critical performance bottlenecks of the future IC generation. The 3D integration technology is expected as the technology of highest potentiality which can replace an embedded system on chip technology.

SUMMARY OF THE INVENTION

According to one of the guide lines for applying passive components to a radio frequency semiconductor device such as an RF-CMOS, Bipolar/SiGe and BiCMOS, in the case of a multi-layer metal wiring structure, an inductor must be formed on a top metal layer in order to minimize a parasitic capacitance to a substrate. In addition, a trench is inserted into the inductor and a thickness of an insulation layer is increased so as to overcome decoupling. The present invention is directed to a radio frequency integrated circuit which can minimize a parasitic capacitance by sufficiently increasing a distance between a semiconductor substrate on which elements have been formed and an inductor, by forming the inductor on a special wafer according to a chip scale integrated process (CIP) which is a 3D integration technology, and bonding the wafer onto another wafer on which the logic elements have been formed, and a method for manufacturing the same.

One aspect of the present invention is to provide a radio frequency integrated circuit including: a first wafer providing an inductor having via contact plugs passing through the first wafer; and a second wafer bonded to the first wafer, wherein the second wafer provides logic devices and inductor connection wires on an upper side thereof.

According to another aspect of the present invention, method of fabricating a high frequency device, includes the steps of: a) providing a first wafer, including the steps of: a1) forming a via hole in the first wafer; a2) forming an insulating layer on the first wafer having the via hole; a3) forming a plurality of first trenches and second trenches in the insulating layer by patterning the insulating layer, wherein the second trenches connect to the via hole; a4) forming an inductor by filling conductive material in the first trenches and forming via contact plugs by filling the conductive material in the second trenches; and a5) exposing a bottom region of the via contact plug by grinding a back side of the first wafer; b) providing a second wafer, including the steps of: b1) forming logic devices on the second wafer; and b2) forming a inductor connection lines on the second wafer; and c) bonding the first wafer and the second wafer.

The large vertical via hole is formed at a size of about 0.5 μm to about 50 μm and a depth of about 1 μm to 300 μm.

The via contact plug of the first wafer and the inductor connection wire are electrically connected each other.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Figure 1A:
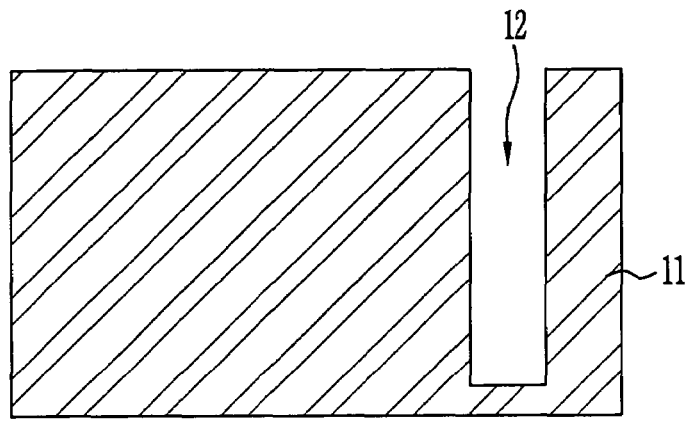
FIGS. 1A to 1G are cross-sectional views illustrating a method for forming an inductor having a via contact plug on a first wafer in accordance with a preferred embodiment of the present invention.

A radio frequency integrated circuit and a method for manufacturing the same in accordance with a preferred embodiment of the present invention will now be described in detail with reference to the accompanying drawings.

In the case that it is described that one film is disposed 'on' another film or a semiconductor substrate, one film can directly contact another film or the semiconductor substrate, or the third film can be positioned between them. In the drawings, a thickness or size of each layer is exaggerated to provide clear and accurate explanations. Wherever possible, the same reference numerals will be used throughout the drawings and the description to refer to the same or like parts.

FIGS. 1A to 1G are cross-sectional views illustrating a method for forming an inductor having a via contact plug on a first wafer to form a radio frequency semiconductor device such as an RF-CMOS, Bipolar/SiGe and BiCMOS in accordance with the preferred embodiment of the present invention.

Referring to FIG. 1A, a large vertical via hole 12 is formed by etching a portion of a first semiconductor substrate 11. The large vertical via hole 12 is an essential element for forming an inductor structure having a high performance by using a CIP in accordance with the present invention. A depth of the large vertical via hole 12 is determined by considering a distance capable of preventing generation of a parasite capacitance between a substrate, in which typical elements are formed, and the inductor. That is to say, the depth of the large vertical via hole 12 plays a role of determining the distance between the inductor and the substrate to be formed on the wafer. Therefore, the large vertical via hole 12 is formed to have a size of about 0.5 μm to about 50 μm and a depth of about 1 μm to about 300 μm.

Figure 1B:
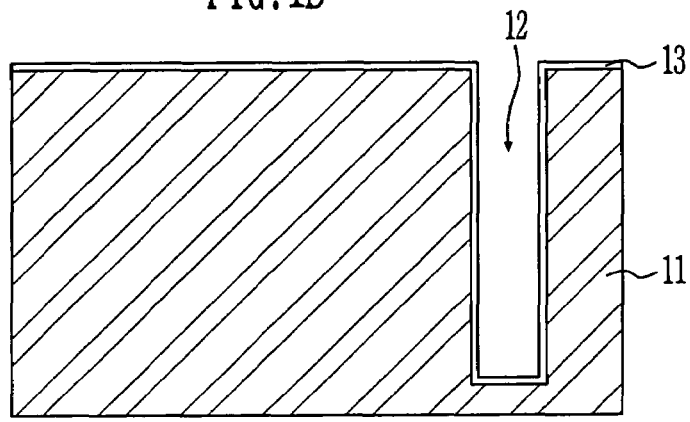

Referring to FIG. 1B, an insulating layer 13 is formed on a surface of the first semiconductor substrate 11 having the large vertical via hole 12. The insulating layer 13 is formed is formed with a low temperature oxide (LTO) or a hot temperature oxide (HTO). The insulating layer is formed to prevent that metal ions are penetrated to the substrate 11 when a diffusion barrier layer or a seed layer is formed at a post process.

Figure 1C:
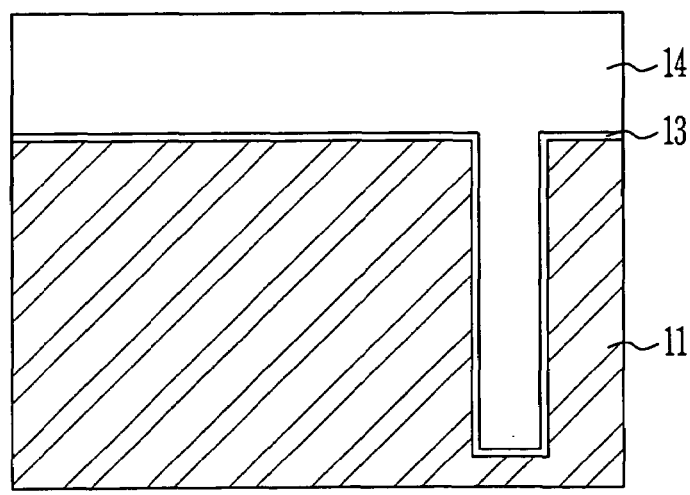

Referring to FIG. 1C, a photoresist layer 14 is coated to form an inductor structure on the first semiconductor substrate 11 in which the insulating layer 13 is formed. A thickness of the photoresist 14 determines a thickness of a metal wire forming the inductor.

Figure 1D:
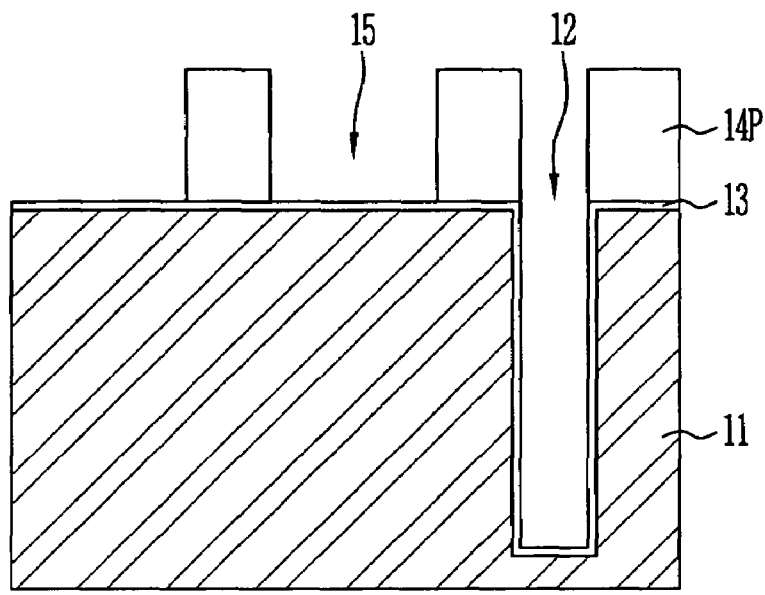

Referring to FIG. 1D, a damascene pattern 15 defined by the photoresist pattern 14P by patterning a portion of the photoresist layer 14 including a portion which the large vertical via hole 12 is located is formed. The damascene pattern 15 is structurally connected to the large vertical via hole 12.

Figure 1E:
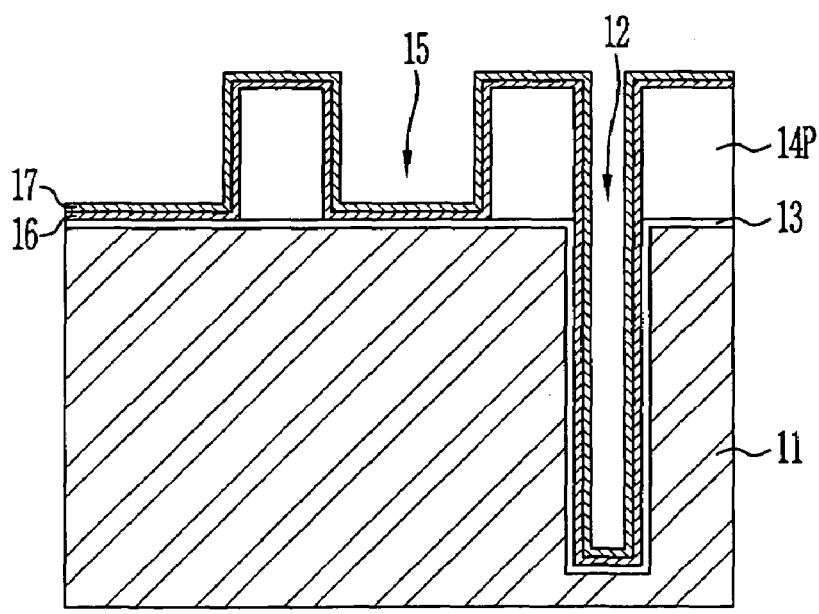

Referring to FIG. 1E, a diffusion barrier layer 16 and a seed layer 17 are sequentially formed on the first substrate 11 including the large vertical via hole 12 and the damascene pattern 15. The diffusion barrier layer 16 is formed with a material selected from a group consisting of ionized PVD TiN, CVD TiN, MOCVD TiN, ionized PVD Ta, ionized PVD TaN, CVD Ta, CVD TaN, CVD WN, PVD TiAlN, PVD TiSiN, PVD TaSiN, CVD TiAlN, CVD TiSiN, CVD TaSiN and stacked material thereof at a thickness of about 100 Å to about 400 Å. The seed layer 16 is formed with a metal selected from a group of Cu, Ag, Au, Ti and Al by using a PVD method, a CVD method, an ALD method, an electro plating method or an electroless plating method at a thickness of about 50 Å and 3000 Å.

Figure 1F:
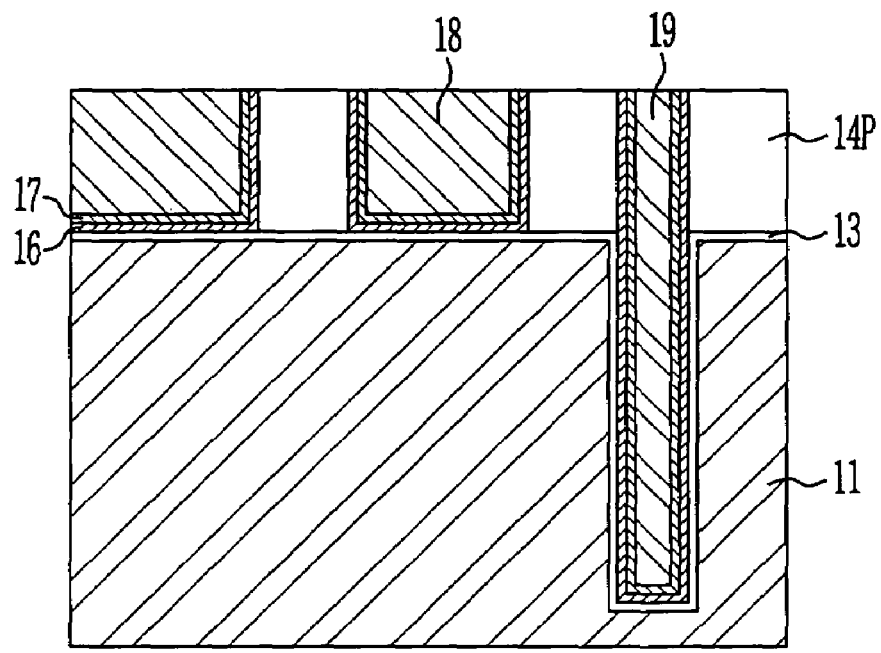

Referring to FIG. 1F, after filling the large vertical via hole 12 and the damascene with a conductive material, a chemical mechanical polishing (CMP) process is carried out until the upper surface of the photoresist pattern 14P is exposed, so that an inductor 18 is formed in the damascene pattern 15 and a via contact hole 19 is formed in the large vertical via hole 12.

The conductive material forming the inductor 18 and the via contact plug 19 may be Cu, Al or W which is typically used as an inductor material in a semiconductor device. A filling process of the conductive material can be achieved by using a general plating process, a selective plating process, a general deposition process, a selective deposition process or the like.

Figure 1G:
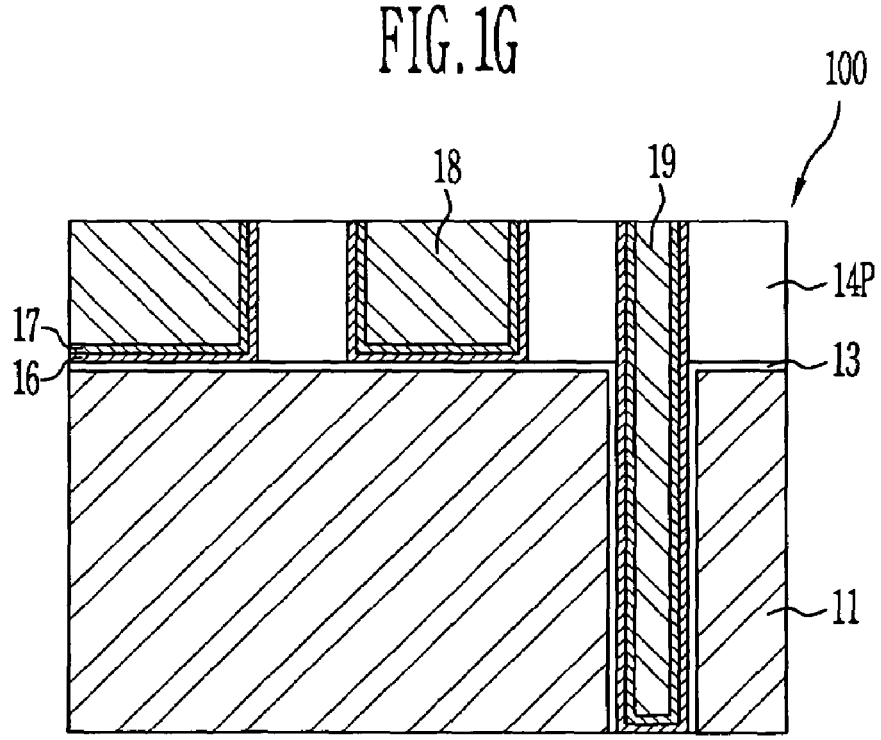

Referring to FIG. 1G, after the inductor 18 and the via contact plug 19 are formed, a backside of the substrate 11 is grinded through a backside grinding process until the backside of the via contact plug 19 is exposed. Therefore, a first wafer 100, in which the inductor 18 and the via contact plug 19 are formed, is fabricated.

Figure 2:
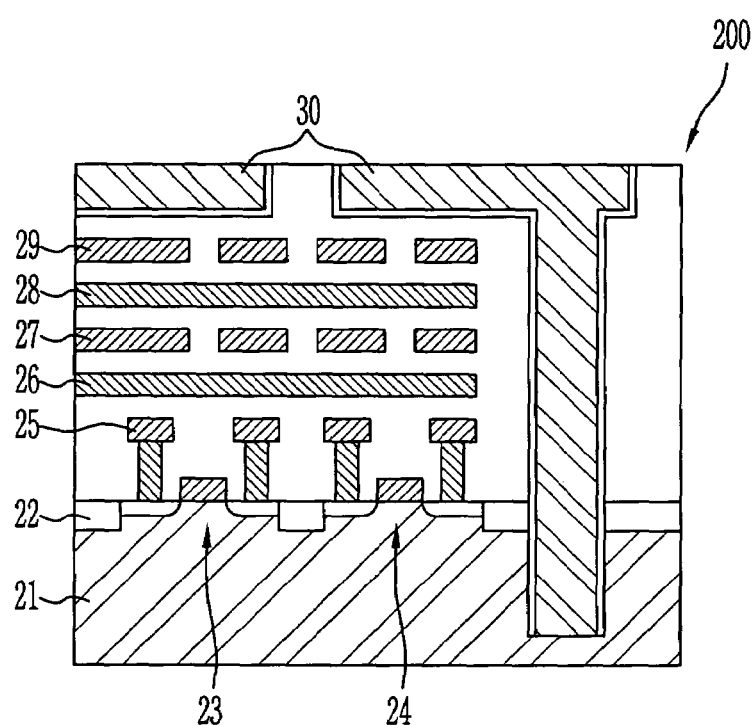
FIG. 2 is a cross-sectional view illustrating a method for forming a logic device having a multi-layer wiring structure on a second wafer in accordance with the preferred embodiment of the present invention.

FIG. 2 is a cross-sectional view illustrating a method for forming a logic device having a multi-layer wiring structure on a second wafer in order to the radio frequency semiconductor device such as the RF-CMOS, Bipolar/SiGe and BiCMOS in accordance with the preferred embodiment of the present invention.

Referring to FIG. 2, a device isolation layer 22 is formed on a second semiconductor substrate 21 on which a well formation process has been performed, and then a PMOS transistor 23 and an NMOS transistor 24 are formed through a gate formation process, a source/drain formation process, a contact process and the like. Thereafter, first to fifth metal wires 25 to 29 are formed by performing a multi metal wire formation process. Herein, a metal wire structure having five metal wire layers is exemplarily described in accordance with the preferred embodiment of the present invention. However, another metal wire structure having more or less metal wire layer can be applied to the present invention. An inductor connection wire 30 is finally formed in order that the inductor is formed on a top metal layer. Therefore, a logic device for forming the radio frequency semiconductor device is formed as a second wafer 200 in which the inductor is not formed.

Also, the large vertical via hole may be applied to the second wafer 200 such as the first wafer 100. The large vertical via hole can be simultaneously formed with the inductor connection wire 30 by applying a process forming the inductor having the via contact plug of the first wafer 100.

Figure 3:
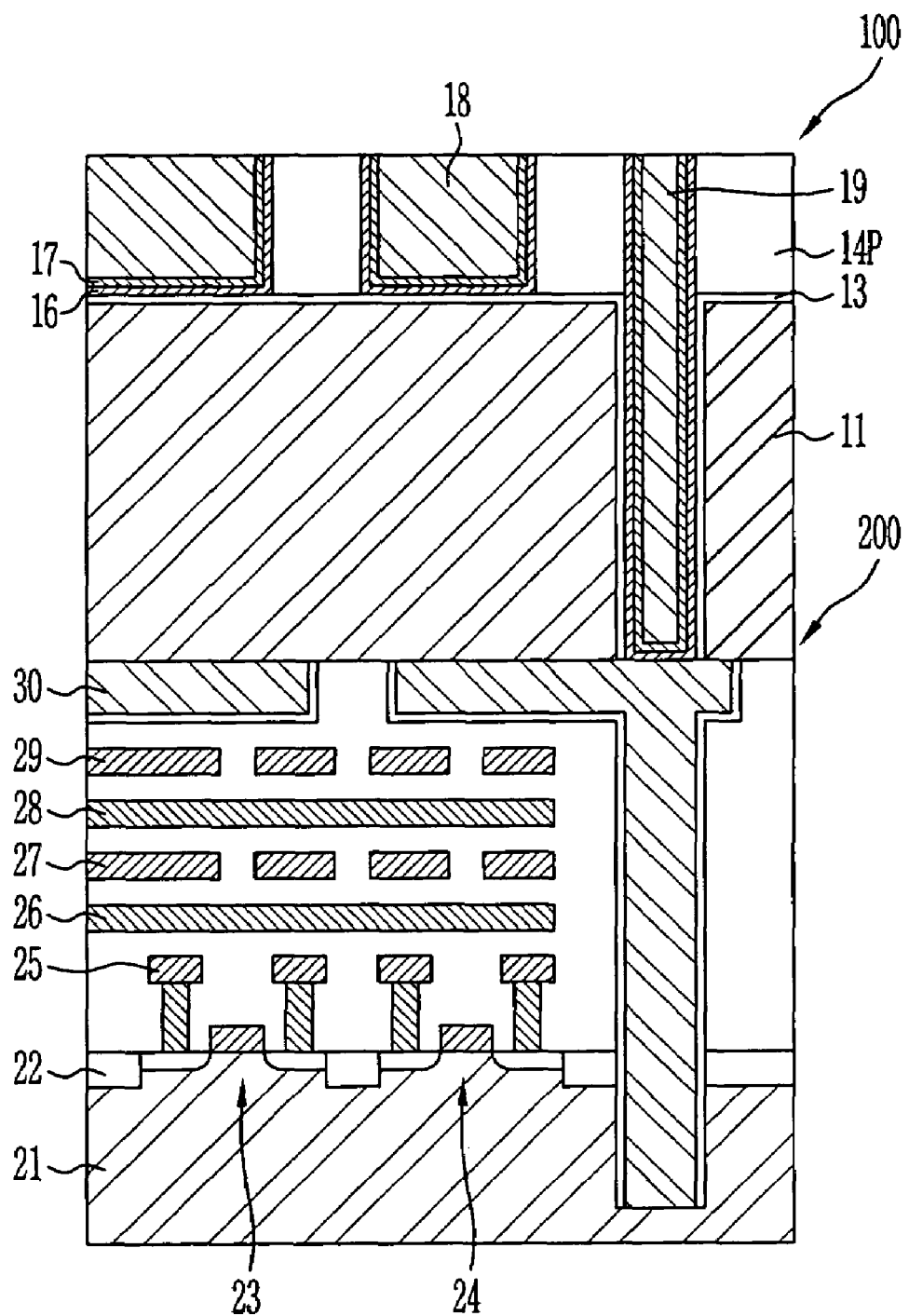
FIG. 3 is a cross-sectional view illustrating the radio frequency semiconductor device bonding the first wafer of FIG. 1G on the second wafer of FIG. 2.

FIG. 3 is a cross-sectional view illustrating the radio frequency semiconductor device bonding the first wafer 100 of FIG. 1G on the second wafer 200 of FIG. 2. In the radio frequency semiconductor device, the via contact plug 19 of the first wafer 100 is electrically connected to the inductor connection wire 30 of the second wafer 200. The first wafer 100 and the second wafer 200 are bonded by a thermal treatment process at an atmosphere of a forming gas such an Ar gas, a $N_2$ gas, a $H_2$+Ar gas or the like and a temperature of about 200° C. to about 50° C. for 1 minute to two hours. A pressure of about 100 mbar to about 10000 mbar are applied to wafer to wafer during the thermal treatment process.

As discussed earlier, in accordance with the present invention, the radio frequency semiconductor device such as the RF-CMOS, Bipolar/SiGe and BiCMOS is manufactured by forming the wafer including the inductor and the wafer including the logic devices, and applying the 3D integration technology connecting wafer to wafer by forming a large vertical via hole formed with the CIP. As a result, since the inductor is formed far from the substrate in which the logic device is formed, the parasitic capacitance can be minimized and the high performance radio frequency semiconductor device is expected.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method of fabricating a high frequency device, comprising the steps of:
    a) providing a first wafer, including the steps of:
        a1) forming a via hole in the first wafer;
        a2) forming an insulating layer on the first wafer having the via hole;
        a3) forming a plurality of first trenches and second trenches in the insulating layer by patterning the insulating layer, wherein the second trenches connect to the via hole;
        a4) forming an inductor by filling conductive material in the first trenches and forming via contact plugs by filling the conductive material in the second trenches; and
        a5) exposing a bottom region of the via contact plug by grinding a back side of the first wafer;
    b) providing a second wafer, including the steps of:
        b1) forming logic devices on the second wafer; and
        b2) forming a inductor connection lines on the second wafer; and
    c) bonding the first wafer and the second wafer, wherein the via contact plugs and the inductor interconnection lines are connected to each other.

2. The method of claim 1, wherein diameter of the via hole ranges from 0.5 μm to 50 μm, and depth of the via hole ranges from 1 μm to 300 μm.

3. The method of claim 1, wherein the insulating layer is formed with LTO or HTO.

4. The method of claim 1, further comprising steps of:
    forming a diffusion barrier layer on the first wafer having the first trenches and the second trenches; and
    forming a seed layer on the diffusion barrier layer.

5. The method of claim 4, wherein the diffusion barrier layer is formed with at least one selected form a group consisting of ionized PVD TiN, CVD TiN, MOCVD TiN, ionized PVD Ta, ionized PVD TaN, CVD Ta, CVD TaN, CVD WN, PVD TiAiN, PVD TiSiN, PVD TaSiN, CVD TiAiN, CVD TiSiN and CVD TaSiN.

6. The method of claim 4, wherein the seed layer is formed with one selected form a group consisting of Cu, Ag, Au, Ti and Al.

7. The method of claim 4, wherein the seed layer is formed with one selected form a group consisting of PVD method, CVD method, ALD method, electro plating and electroless plating.

8. The method of claim 4, wherein the conductive material is one selected from a group consisting of Cu, Al and W.

9. The method of claim 1, wherein at the step of c), pressure ranging from 100 mbar to 10000 mbar is applied to the first and second wafers.

10. The method of claim 9, wherein at the step of c), a thermal process is performed at temperature ranging from 200° C. to 500° C. for 1 min. to 2 hrs.

11. The method of claim 9, wherein the thermal process is performed in an ambient of Ar gas, $N_2$ gas, a mixture gas of $H_2$ and Ar or a mixture gas of $H_2$ and $N_2$.

* * * * *